United States Patent
Cosman et al.

(10) Patent No.: US 11,460,485 B2
(45) Date of Patent: Oct. 4, 2022

(54) DIRECT METALIZED GUIDE PLATE

(71) Applicant: FormFactor, Inc., Livermore, CA (US)

(72) Inventors: Jason William Cosman, Livermore, CA (US); Benjamin N. Eldridge, Danville, CA (US); Eric Hill, Portland, OR (US); John Ebner, Portland, OR (US); Edin Sijercic, Portland, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/164,326

(22) Filed: Oct. 18, 2018

(65) Prior Publication Data

US 2019/0120876 A1 Apr. 25, 2019

Related U.S. Application Data

(60) Provisional application No. 62/595,492, filed on Dec. 6, 2017, provisional application No. 62/575,170, filed on Oct. 20, 2017.

(51) Int. Cl.
*G01R 1/073* (2006.01)
*G01R 3/00* (2006.01)
*H03H 7/38* (2006.01)
*G01R 1/067* (2006.01)

(52) U.S. Cl.
CPC ..... *G01R 1/07342* (2013.01); *G01R 1/07314* (2013.01); *G01R 1/07371* (2013.01); *G01R 3/00* (2013.01); *H03H 7/38* (2013.01); *G01R 1/06772* (2013.01)

(58) Field of Classification Search
CPC .. G01R 3/00; G01R 1/06722; G01R 1/06761; G01R 1/07342; G01R 1/07371; G01R 1/07378; H01L 41/47
See application file for complete search history.

(56) References Cited

U.S. PATENT DOCUMENTS

| | | |
|---|---|---|
| 5,923,178 A | 7/1999 | Higgins |
| 6,242,930 B1 | 6/2001 | Matsunaga |
| 6,404,211 B2 | 6/2002 | Hamel |
| 7,368,928 B2 | 5/2008 | Lin |

(Continued)

FOREIGN PATENT DOCUMENTS

| | | |
|---|---|---|
| JP | 2010216847 | 9/2010 |
| KR | 101467383 | 12/2014 |

(Continued)

OTHER PUBLICATIONS

Translation of JP 2010216847A (Year: 2021).*

*Primary Examiner* — Son T Le
*Assistant Examiner* — Adam S Clarke
(74) *Attorney, Agent, or Firm* — Lumen Patent Firm

(57) ABSTRACT

Improved electrically conductive guide plates for vertical probe arrays are provided by patterning a thin metal layer disposed on an insulating substrate. Holes passing through the guide plate for guiding probes can be electrically connected or isolated from each other in any pattern according to the deposition of the metal. Such structures can include several distinct ground and/or voltage planes. Furthermore, passive electrical components can be included in the guide plate, by patterning of the deposited metal and/or by integration of passive electrical components with the deposited metal traces.

12 Claims, 10 Drawing Sheets

(56) References Cited

U.S. PATENT DOCUMENTS

| | | | |
|---|---|---|---|
| 2002/0025603 A1* | 2/2002 | Ondricek | H05K 3/325 |
| | | | 438/117 |
| 2007/0111560 A1* | 5/2007 | Kazama | G01R 1/07371 |
| | | | 439/71 |
| 2008/0054918 A1 | 3/2008 | Lin | |
| 2008/0265919 A1 | 10/2008 | Izadian | |
| 2009/0242405 A1 | 10/2009 | Mayer | |
| 2010/0244867 A1 | 9/2010 | Chong | |
| 2013/0069683 A1* | 3/2013 | Kuo | H05K 3/00 |
| | | | 324/755.03 |
| 2015/0015289 A1 | 1/2015 | Eldridge | |
| 2015/0198632 A1* | 7/2015 | Kim | G01R 1/07342 |
| | | | 324/750.25 |
| 2015/0309074 A1 | 10/2015 | Kuo | |
| 2016/0118738 A1* | 4/2016 | Nasu | G01R 1/06722 |
| | | | 439/700 |
| 2016/0274147 A1* | 9/2016 | Hsu | G01R 1/07378 |
| 2017/0146569 A1* | 5/2017 | Shimizu | G01R 31/2601 |
| 2017/0242057 A1* | 8/2017 | Mori | G01R 1/07342 |
| 2019/0353684 A1* | 11/2019 | Kaida | G01R 31/2887 |

FOREIGN PATENT DOCUMENTS

| | | |
|---|---|---|
| WO | WO2012106220 | 8/2012 |
| WO | WO2018108790 | 6/2018 |

* cited by examiner

DIRECT METALIZED GUIDE PLATE

CROSS REFERENCE TO RELATED APPLICATIONS

This application claims the benefit of U.S. provisional patent application 62/575,170, filed on Oct. 20, 2017, and hereby incorporated by reference in its entirety.

This application claims the benefit of U.S. provisional patent application 62/595,492, filed on Dec. 6, 2017, and hereby incorporated by reference in its entirety.

FIELD OF THE INVENTION

This invention relates to vertical probe arrays for testing electrical devices and circuits.

BACKGROUND

Probe arrays for testing electrical devices and circuits often include guide plates to control the positions of the probes. One kind of guide plate that is currently in use is a ceramic-metal guide plate, where a ceramic guide plate and a metal guide plate having corresponding hole patterns are finished separately and then bonded together. The resulting structure includes a single metal ground plane for all contacts. Alternatively, such metal planes can be held at other convenient voltages, such as power supply voltages. Electrically conductive guide plates are relatively unusual in the art, but they have been considered in US 2015/0015289.

SUMMARY

In this work, we provide an alternative approach for making ceramic-metal guide plates. In this approach, the ceramic guide plate is used as a substrate for deposition of metal (e.g., by electroforming). The resulting structure can include several distinct ground and/or voltage planes. Furthermore, passive electrical components can be included in the guide plate, by patterning of the deposited metal and/or by integration of passive electrical components with the deposited metal traces. Holes passing through the guide plate for guiding probes can be electrically connected or isolated from each other in any pattern according to the deposition of the metal.

Preferred embodiments of the invention can also improve high frequency probing performance. Probing of electrical circuits and devices at high frequency can be complicated by the need to provide a transmission line from the test instrumentation to the device under test (DUT) which allows effective power transfer. A significant problem with current spring probe based contact solutions is associated with the length of the contact spring probe which creates a region of high impedance in this transmission line. Lack of constant impedance causes reflections in the transmission lines in the probe head and degrades insertion and return loss. The main issue for impedance control is the relatively large inductance provided by the probes. Some existing work on such probe arrays uses probe guide plates with thick metal layers (typically about 100 microns thick) separately fabricated from ceramic substrates and then bonded together to form the guide plate. Such structures can provide the required capacitance for impedance matching by tuning the relevant gaps and the metal thickness. However, such separate fabrication of the metal layers and ceramic substrates undesirably increases fabrication cost. To reduce these costs, it is preferred to use thin metal layers (i.e., thickness of 10 microns or less, more preferably about 3 microns) that are deposited on the ceramic substrates and then patterned to provide the desired features. Deposition and patterning of the metal layer can also be simultaneous, e.g., plating a metal layer over a pattern defined by a mask. Practice of the invention does not depend critically on whether deposition and patterning of the metal layer are sequential or simultaneous, although simultaneous tends to be more common in practice. But metal-coated guide plates with nominally-sized holes will likely not include sufficient capacitance to have a meaningful impact on impedance.

Accordingly, preferred embodiments can address this problem by providing suitable capacitance enhancing structures on metal-coated guide plates. More specifically, the RF performance of a spring probe head can be improved by incorporating lumped element capacitance into the probe head to offset the inductance that is inherent in a long vertical spring probe. By designing high-capacitance structures that are built into the metal coated guide plate, we can greatly improve RF performance. In one example, the design goal is to extend the RF performance to 30 GHz, with impedance in the probe head within 2-3Ω (20-30 mrho).

Significant features can include the following, either individually or in any combination:

a) Patterned metal on a ceramic guide plate. Metal pattern may include small gaps (1 μm, 5 μm, or 10 μm) to create relatively large capacitance. Metal pattern may include interdigitated fingers to increase capacitance.
b) May include patterned dielectric on a ceramic guide plate.
c) May include multiple layers of alternating metal/dielectric on a ceramic guide plate to create relatively large capacitance.
d) Structures to electrically connect probe pins to patterned metal on ceramic guide plate.
e) Structures to create capacitance tuned by design to compensate for the native probe inductance.
f) Capacitor structures on guide plates where the capacitance value between each signal pin and ground is tuned on a probe-per-probe basis.
g) Methods for forming capacitor structure on metal coated guide plates.
h) The use of one or more intermediate guide plates to provide additional capacitive elements for impedance matching. This can be viewed as formation of a synthetic transmission line using capacitors formed on three or more guide plates, not just the top and a bottom guide plates. One or more intermediate guide plates between the top and bottom guide plates that are electrically similar to the top and bottom guide plates effectively add lumped element capacitors close to the center of the inductive RF probe pins. These additional elements should allow us to more closely approximate a transmission line to reduce signal loss from impedance mismatches.

Significant advantages are provided. Current testing results show that non-optimized, assembled metal guide plates have insignificant impact on RF insertion and return loss at the signal-ground pin pitches typical of customer pad layouts. Initial simulation results of this approach show that increasing the guide plate capacitance improves the impedance at the tip and improves the return loss.

DETAILED DESCRIPTION

Figure 1:
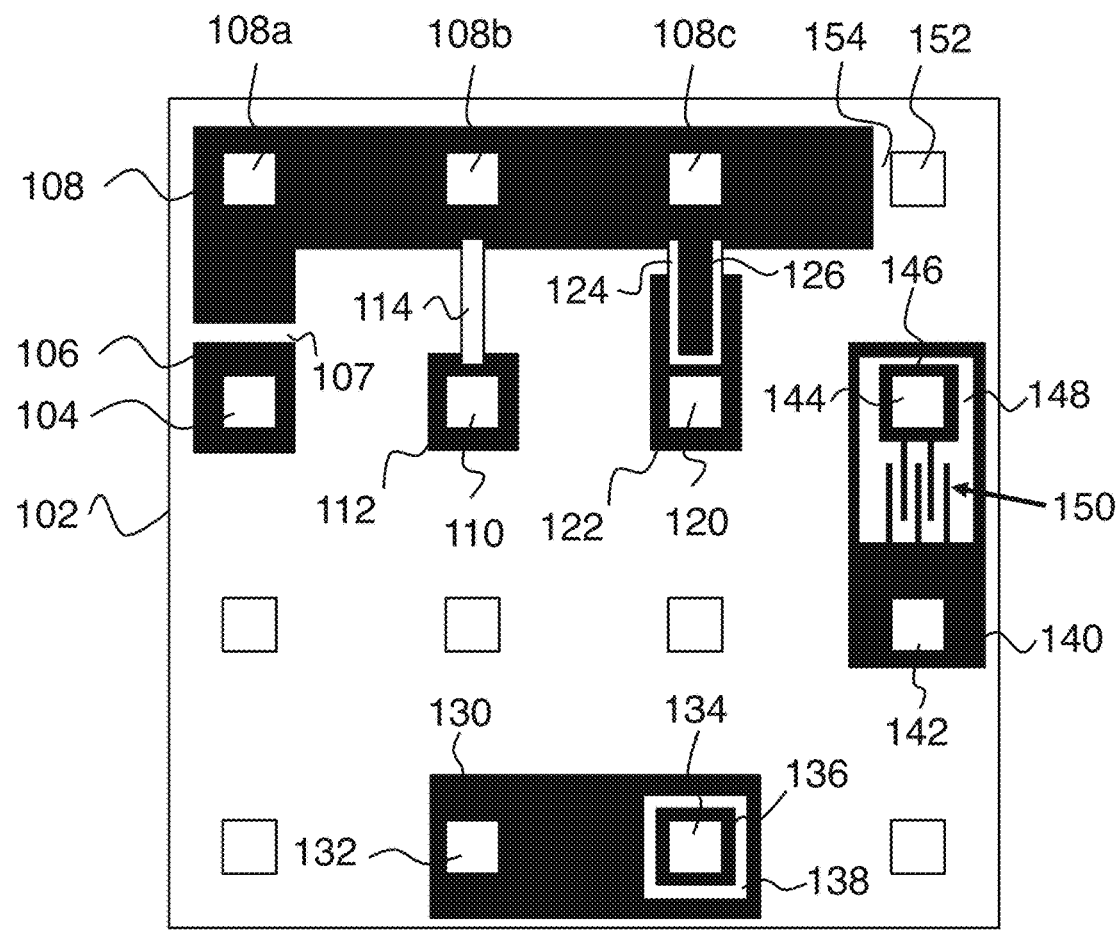
FIG. 1 shows a top view of an embodiment of the invention having several exemplary features of preferred embodiments.

FIG. 1 shows a top view of an embodiment of the invention having several exemplary features of preferred embodiments. Here a guide plate for a probe array includes an electrically insulating ceramic substrate 102 having a hole pattern corresponding to a predetermined probe pattern, and a patterned metal layer disposed on the ceramic substrate such that at least two holes of the hole pattern are electrically connected to each other, and such that at least two holes of the hole pattern are electrically insulated from each other. Here the metal pattern is shown with black shading. As an example of the preceding, holes 108b, 108c and 152 satisfy the stated conditions because holes 108b and 108c are electrically connected to each other by feature 108 of the patterned metal layer, while holes 108c and 152 are electrically insulated from each other. Preferably the thickness of the patterned metal layer is 10 microns or less.

The use of a patterned metal layer on a guide plate for vertical probes provides a great deal of flexibility in probe array design. FIG. 1 shows several examples of the kinds of structures that can be employed. One or more probes can be electrically connected to each other by electrically connecting their corresponding holes. For example, holes 108a, 108b, 108c are electrically connected by feature 108 of the patterned metal layer. This is most often done for holes that correspond to ground probes of the predetermined probe pattern. The impedance between a signal probe and the nearby ground probe(s) can be altered in several ways using patterned metal guide plates. The most general approach is shown by signal hole 110 that has signal metal 112 disposed in it and around it such that a passive component structure 114 can be connected between signal metal 112 and ground metal 108. Passive component structure 114 can include any number of integrated or discrete component devices, including but not limited to: integrated capacitors, discrete component capacitors, integrated inductors, discrete component inductors, integrated resistors, and discrete component resistors. Several examples are described below. The main purpose of such passive component structures is to provide a compensating impedance between holes to improve probing performance, as described in greater detail below.

Compensating impedances can be defined by features of the patterned metal layer in various ways. For example, a capacitor can be provided by a gap 154 between a signal hole 152 and a ground part 108 of the patterned metal layer connected to a ground hole (108a, 108b, 108c) of the predetermined probe pattern. Alternatively, a capacitor can be provided by a gap 138 between a signal part 136 of the patterned metal layer connected to a signal hole 134 of the predetermined probe pattern and a ground part 130 of the patterned metal layer connected to a ground hole 132 of the predetermined probe pattern. As another example, a capacitor can be provided by a gap 107 between a signal part 106 of the patterned metal layer connected to a signal hole 104 of the predetermined probe pattern and a ground part 108 of the patterned metal layer connected to a ground hole (108a, 108b, 108c) of the predetermined probe pattern.

The gap between the signal part and ground part of the patterned metal layer can have any shape. For example, a capacitor can be provided by a gap 148 between a signal part 146 of the patterned metal layer connected to a signal hole 144 of the predetermined probe pattern and a ground part 140 of the patterned metal layer connected to a ground hole 142 of the predetermined probe pattern such that gap 148 is configured as a spacing between two interdigitated metal regions 150.

Three dimensional integrated structures can also be used to provide capacitance between signal and ground parts of the patterned metal layer. For example, a capacitor can be provided by stacking finger 126 of ground part 108 of the patterned metal layer on top of a dielectric 124 which in turn is stacked on top of a signal part 122 of the patterned metal layer. The resulting capacitance is between signal hole 120 and ground holes (108a, 108b, 108c).

Metal on side walls of the holes can also contribute to capacitance, and designs along these lines will need to consider the dielectric properties of the guide plate substrate material.

Figure 2A:
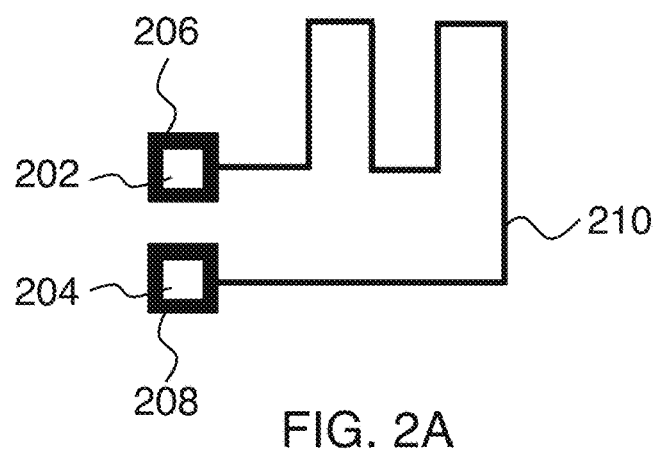
FIGS. 2A-C show exemplary structures for thin-film resistors and inductors.
Figure 2B:
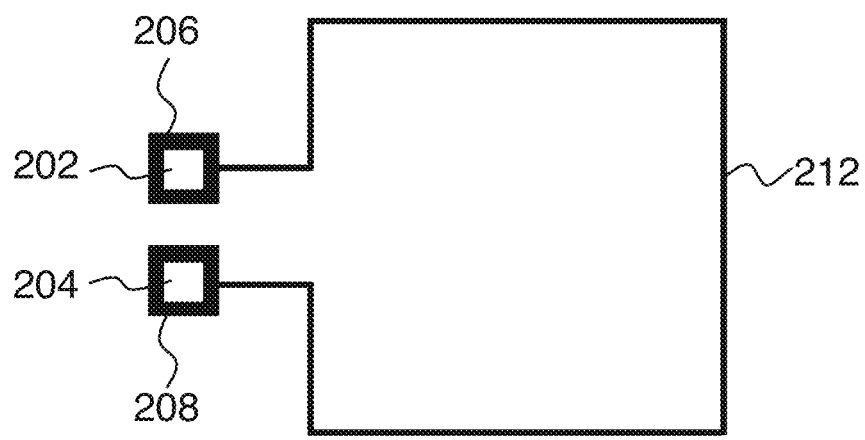
Figure 2C:
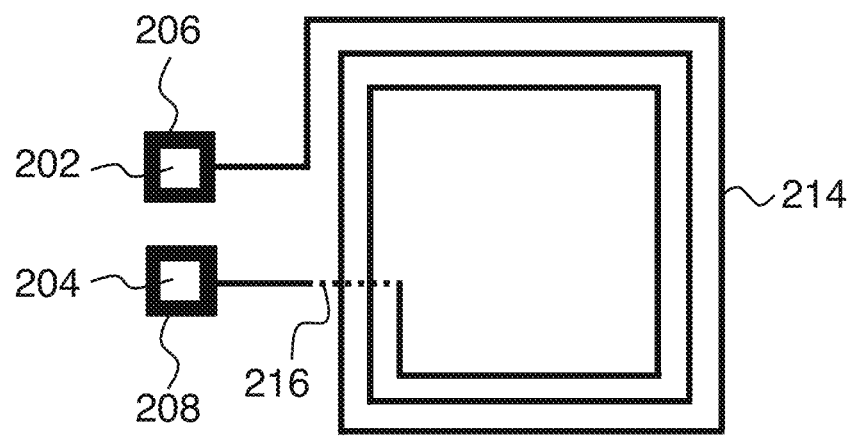

The preceding examples relate to providing capacitance, since the required compensating impedance for vertical probes tends to be capacitive. However, integrated resistors and integrated inductors can also be fabricated on patterned metal guide plates. FIGS. 2A-C show exemplary structures for thin-film resistors and inductors. Here 202 and 204 are two holes of the probe pattern, and 206 and 208 are corresponding parts of the patterned metal layers connected to holes 202 and 204 respectively.

FIG. 2A shows a resistor provided by a metal trace 2110. Here trace 210 is not limited to the shape shown, but can have arbitrary shape. Two fabrication approaches are possible: A thin trace of the base metal can be used such that the resistance of the trace meets the target resistance for the design; or a trace of a conductor whose resistance is high compared to the base metal of the guide plate pattern can be used. For the second option, the high-resistance material can be applied by plating, physical vapor deposition, or chemical vapor deposition.

FIG. 2B shows an inductor provided by a 1-turn metal loop 212. Other shapes can be used. FIG. 2C shows an inductor provided by a multi-turn planar coil 214, where an air bridge 216 is employed to make the connection to hole 204 without contacting the loops of coil it crosses. Any shape or number of turns can be used in such a coil.

Figure 3:
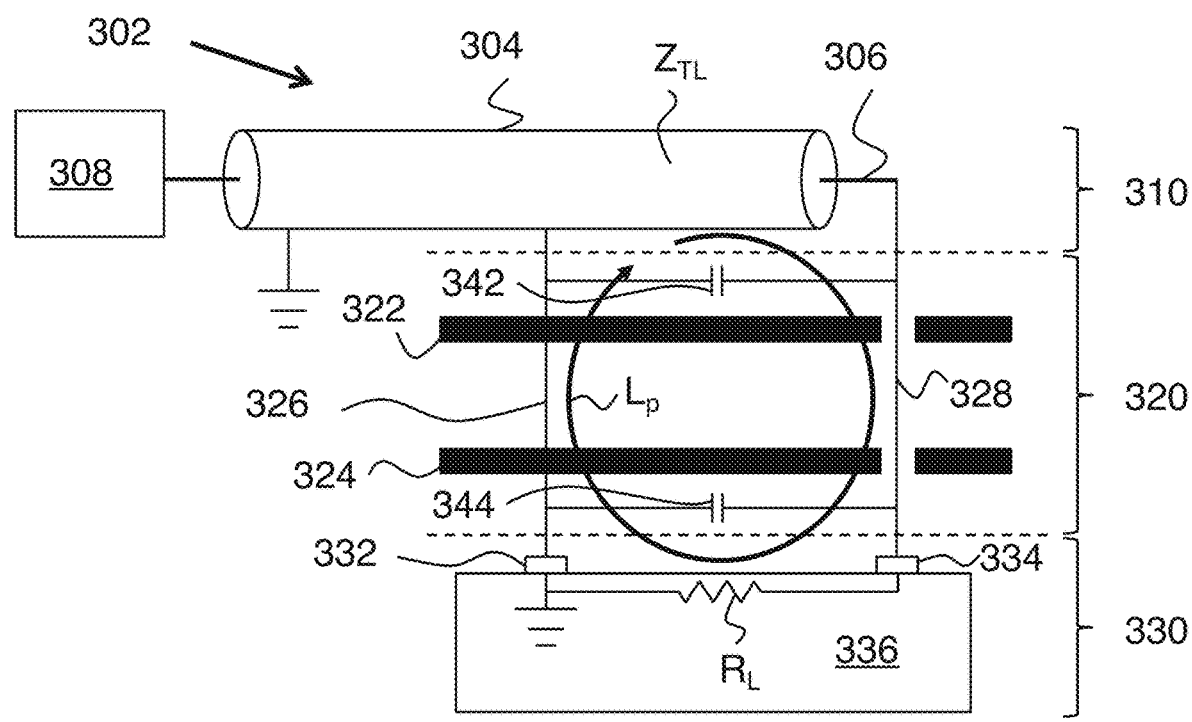
FIG. 3 schematically shows the impedance compensation approach of several preferred embodiments.

FIG. 3 schematically shows the impedance compensation approach of several preferred embodiments. Here a probing arrangement 302 includes a space transformer 310, a probe head 320 and test target 330. Signal probe 328 and ground probe 326 make contact, respectively, to contact pads 334 and 332 of device under test 336. Device under test 336 is schematically shown as having load resistance $R_L$, typically 50Ω. Space transformer 310 is schematically shown as having a test instrument source 308 that provides a test signal on a transmission line formed by shield 304 and central conductor 306. This transmission line has a characteristic impedance of $Z_{TL}$, typically 50Ω. Probe head 320 includes guide plates 322 and 324. Ground probe 326 is connected to shield 304 and signal probe 328 is connected to central conductor 306.

From FIG. 3, it is apparent that the main local current path is from central conductor 306 down signal probe 328, through device under test 336, and returning on ground probe 326. As a result, this probing configuration tends to have an inductive impedance, schematically referenced as $L_p$, especially because the lengths of probes 326 and 328 unavoidably tend to be very large compared to other relevant geometrical parameters of the circuit. Since capacitance and inductance provide reactances having opposite signs, it follows that adding suitable capacitances 342 and 344 in metal guide plate structures can improve the impedance match for probing devices at high frequencies.

Accordingly, a preferred embodiment of the invention includes:

a top guide plate having compensating impedances as described above;

a bottom guide plate having compensating impedances as described above; and a probe array including two or more probes, where each probe of the probe array passes through corresponding holes in the top guide plate and in the bottom guide plate.

Here at least one of the probes of the probe array is a ground probe making electrical contact to the top guide plate and to the bottom guide plate, and at least one of the probes of the probe array is a signal probe that is electrically insulated from the ground probe. The compensating impedances of the top and bottom guide plates are preferably configured to improve an impedance match for probing a device under test with the signal probe and the ground probe.

FIGS. 4-7 show side views of several exemplary embodiments. In cases where there are corresponding features on FIG. 1, this is noted.

Figure 4:
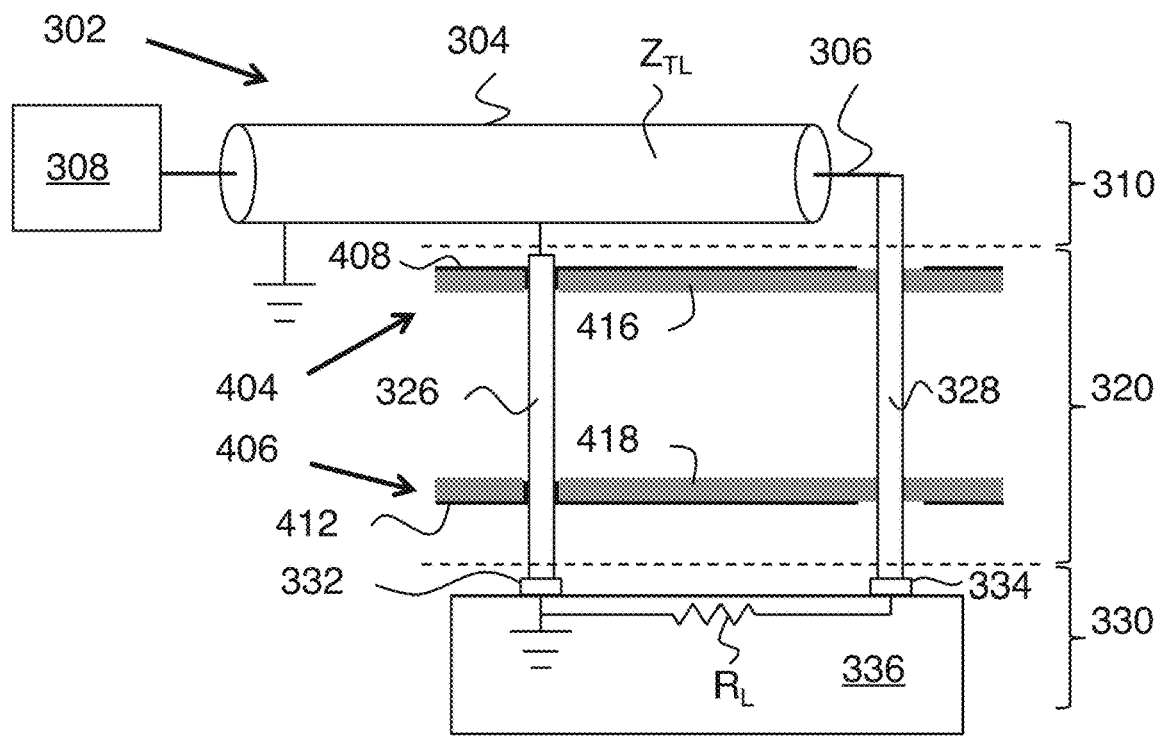
FIG. 4 is a side view of a first embodiment.

In the example of FIG. 4, top guide plate 404 includes ceramic substrate 416 and ground part 408 of the patterned metal layer, and bottom guide plate 406 includes ceramic substrate 418 and ground part 412 of the patterned metal layer. Here the compensating capacitance is formed by the gaps between signal probe 328 and ground parts 408 and 412. This case corresponds roughly to signal hole 152 being separated from ground part 108 of the patterned metal layer by a gap 154 on FIG. 1. When hole 152 of FIG. 1 is occupied by a signal probe, gap 154 leads to a capacitance between signal and ground.

Figure 5:
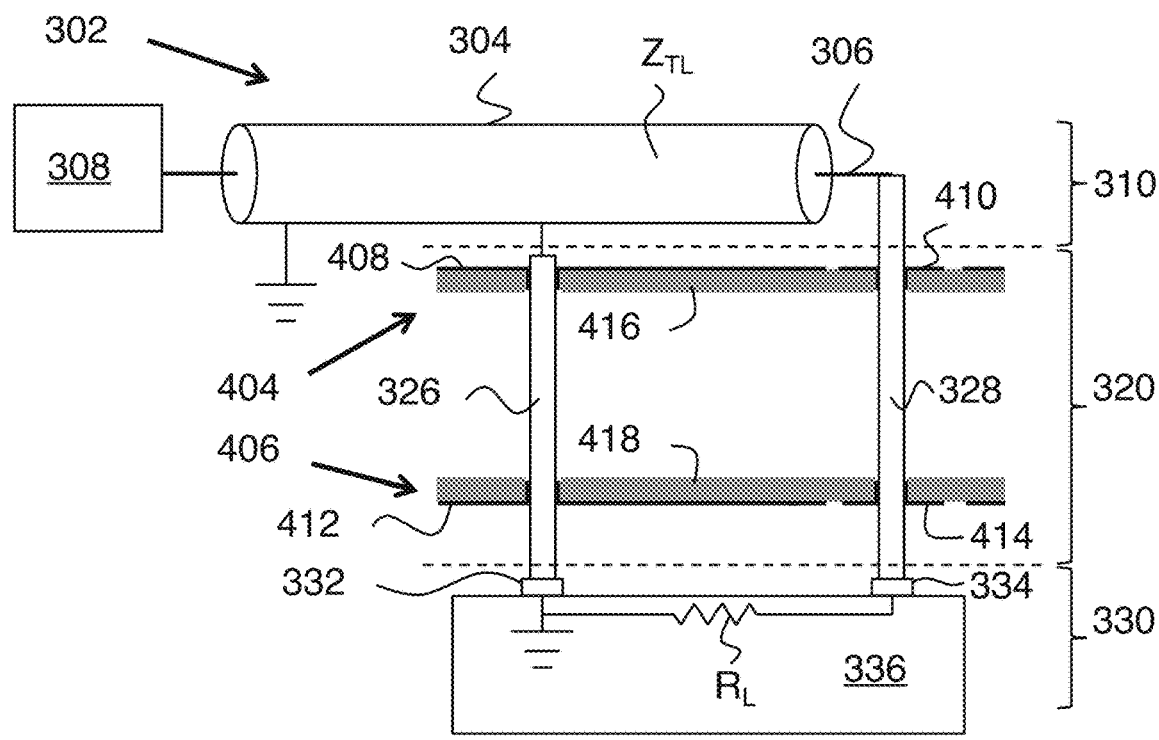
FIG. 5 is a side view of a second embodiment.

In the example of FIG. 5, top guide plate 404 further includes signal part 410 of the patterned metal layer, and bottom guide plate 406 further includes signal part 414 of the patterned metal layer. Here the compensating capacitance is formed by the gaps between signal parts 410, 414 of the patterned metal layer and ground parts 408, 412 of the patterned metal layer, respectively. This case corresponds roughly to the capacitance provided on FIG. 1 by gap 107 between signal part 106 and ground part 108 of the patterned metal layer.

Figure 6:
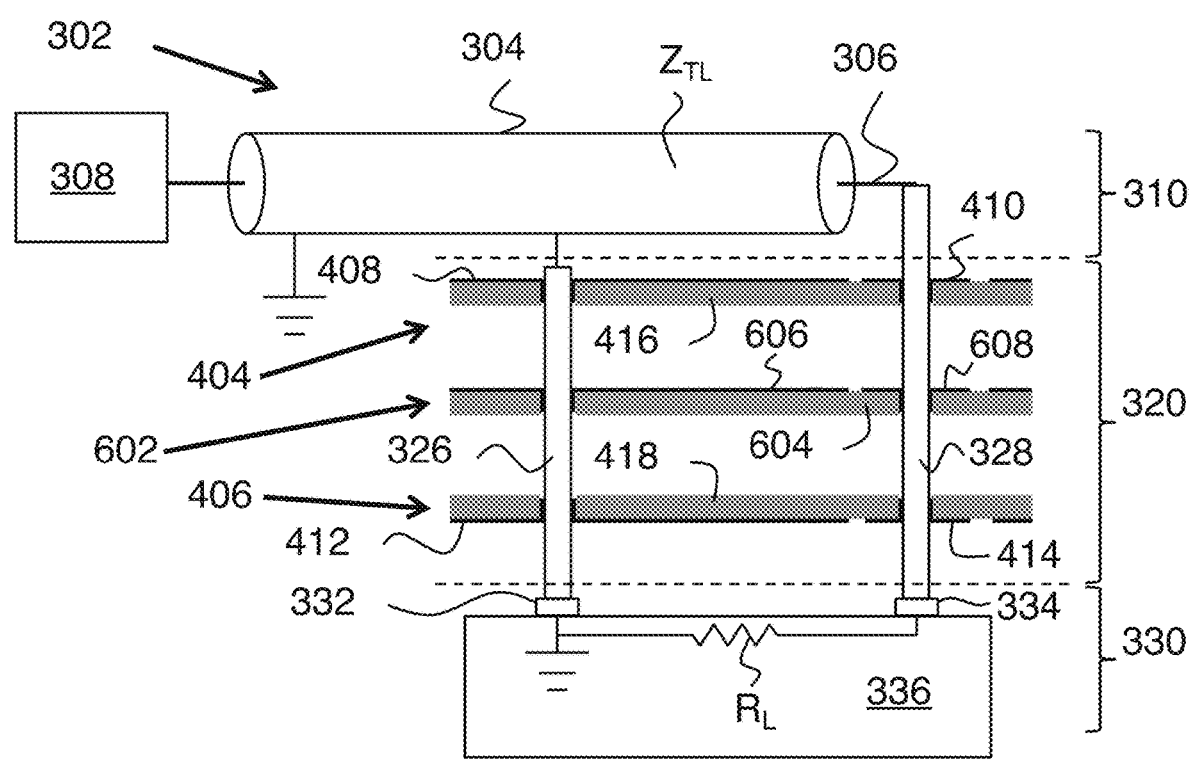
FIG. 6 is a side view of a third embodiment.

The example of FIG. 6 is like the example of FIG. 5, with the addition of an intermediate guide plate 602 having similar structure as the top and bottom guide plates of the probe array. Intermediate guide plate 602 includes a ceramic substrate 604 and signal and ground parts 608 and 606 of the patterned metal layer, respectively. The compensating capacitance of the intermediate guide plate is formed by the gaps between signal part 608 and ground part 606 of the patterned metal layer. One or more such intermediate guide plates can be used. Each probe of the probe array passes through corresponding holes in the one or more intermediate guide plates. The compensating impedances of the intermediate guide plates are preferably configured to improve the impedance match for probing a device under test with the signal probe and the ground probe.

Figure 7:
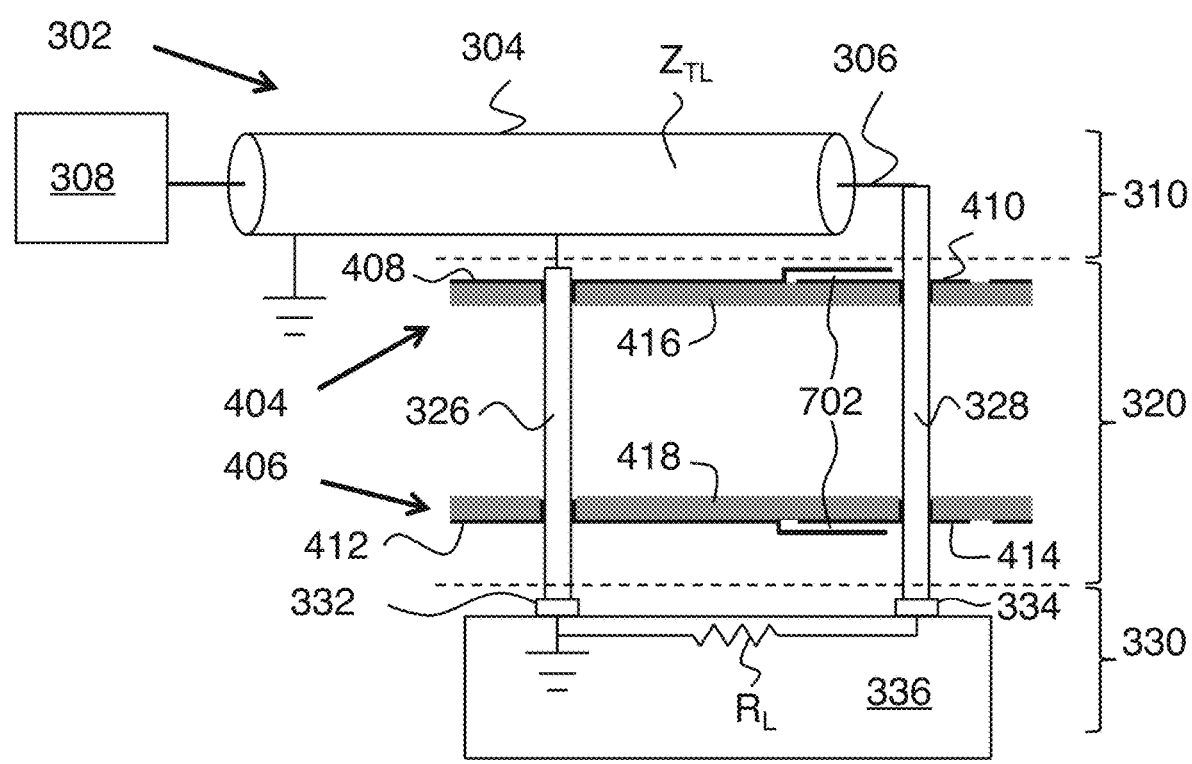
FIG. 7 is a side view of a fourth embodiment.

The example of FIG. 7 is like the example of FIG. 5, with the addition of dielectric 702 such that a 3-D capacitor structure is formed between signal part 410 and ground part 408 of the patterned metal layer on the upper guide plate, and between signal part 414 and ground part 412 of the patterned metal layer on the lower guide plate. In this way, the capacitance can be increased to values higher than can readily be obtained in a 2-D capacitance structure. Here the air-dielectric interface is not explicitly shown with a line, to avoid confusing that line with a metal connection that would short out the capacitor. A more realistic view of such dielectric structures is shown below in connection with FIGS. 10A-H.

Embodiments of the invention include methods of making guide plates as described above. One such method includes:

providing an electrically insulating ceramic substrate having a hole pattern corresponding to a predetermined probe pattern; and depositing and patterning a metal layer on the ceramic substrate such that at least two holes of the hole pattern are electrically connected to each other, and such that at least two holes of the hole pattern are electrically insulated from each other. Preferably a thickness of the patterned metal layer is 10 microns or less.

Several exemplary fabrication sequences are shown on the following figures.

Figure 8A:
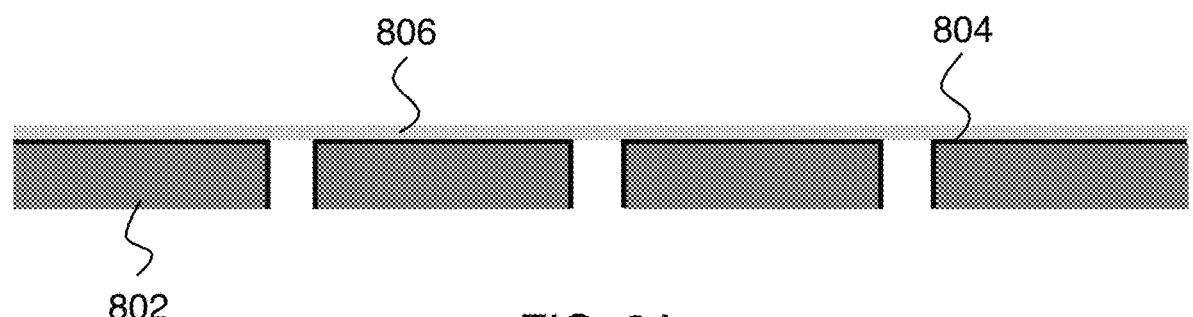
FIGS. 8A-8D show a first exemplary fabrication sequence.

FIGS. 8A-8D show a first exemplary fabrication sequence. FIG. 8A shows the result of drilling holes in ceramic substrate 802, followed by deposition of seed metal layer 804 (e.g., by sputtering), followed by deposition of photoresist 806.

Figure 8B:
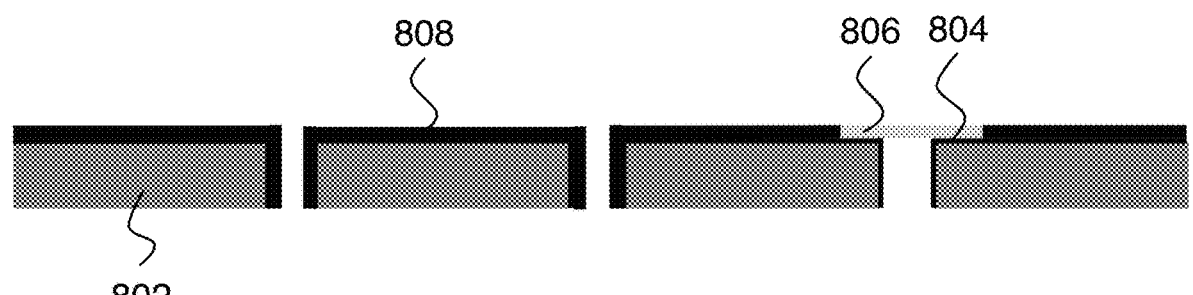

FIG. 8B shows the result of patterning photoresist 806 (i.e., exposing it through a mask and developing the resulting pattern), followed by deposition of metal 808 (e.g., by plating). Here seed metal layer 804 needs to be present for the plating of metal 808 to be possible.

Figure 8C:
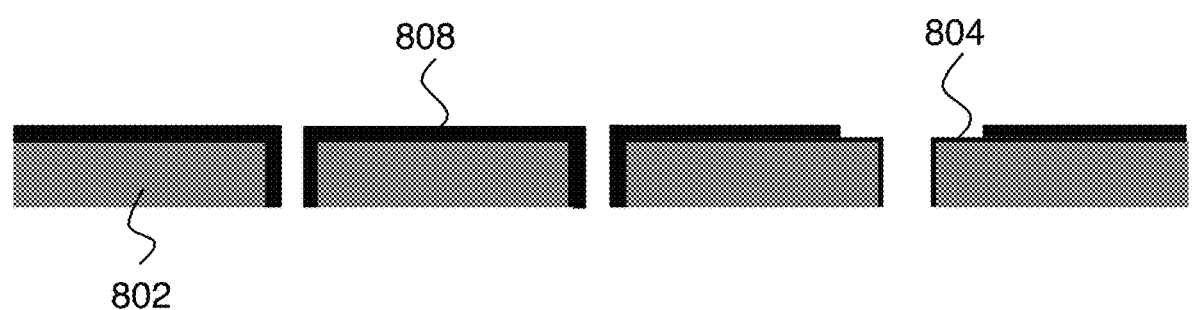
Figure 8D:
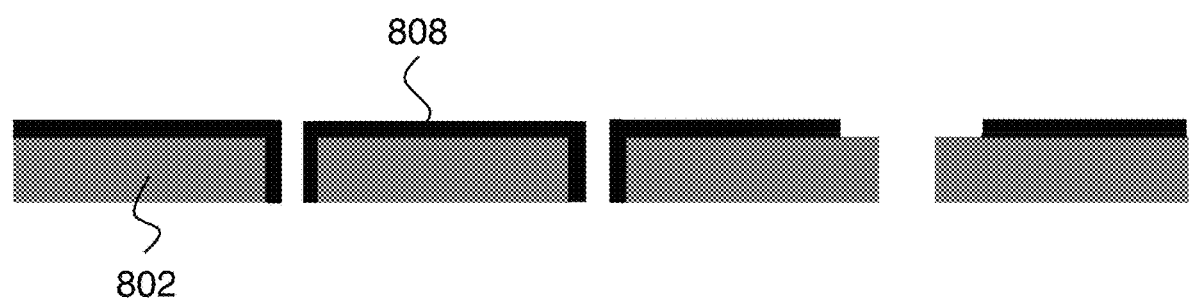

FIG. 8C shows the result of removing photoresist 806, and FIG. 8D shows a finished guide plate after etching away the metal seed layer. Metal seed layer 804 can be much thinner than metal layer 808, so an etch sufficient to remove metal seed layer 804 will leave metal layer 808 substantially unaffected, e.g., simply by timing the etch appropriately. A preferred alternative is for seed layer 804 and metal layer 808 to have different metallic compositions such that an etch for seed layer 804 does not attack metal layer 808. For example, if seed layer 804 is copper and metal layer 808 is gold, etches that selectively attack copper while not attacking gold are readily available. As can be seen on FIG. 8D, the result is a guide plate where some holes can be electrically connected to each other and other holes can be electrically insulated from each other, in any pattern desired.

Figure 9A:
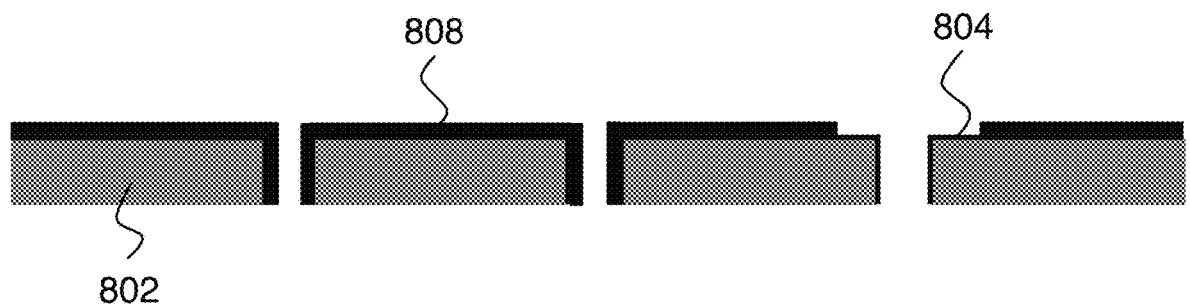
FIGS. 9A-9C show a second exemplary fabrication sequence.
Figure 9B:
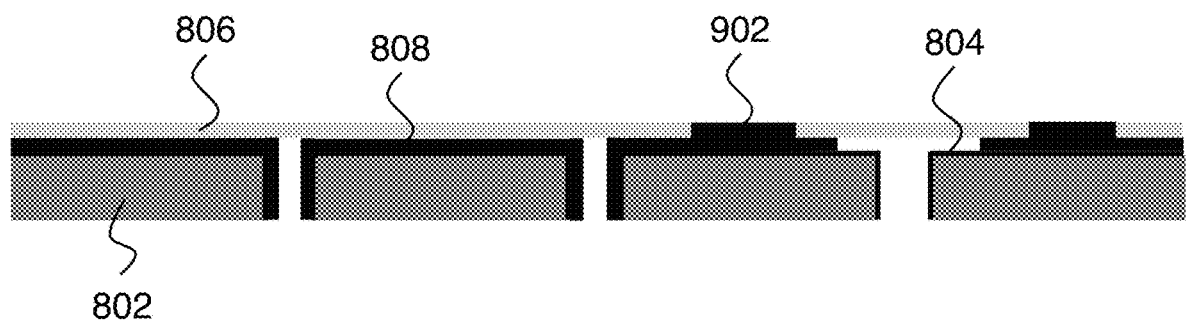
Figure 9C:
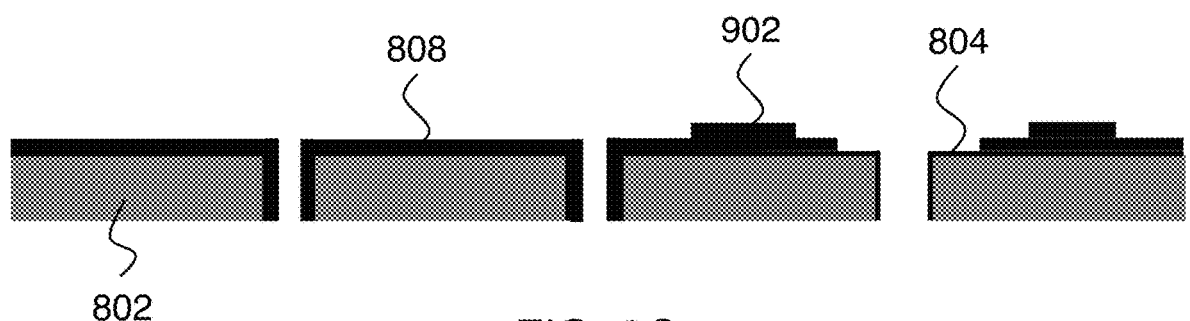

Further processing can be done with this as a starting point. FIGS. 9A-9C show a second exemplary fabrication sequence where FIG. 9A shows the starting point of FIG. 8C. FIG. 9B shows the result of depositing photoresist 806, patterning the photoresist, and depositing second metal layer 902 in the resulting openings. FIG. 9C shows the result of removing photoresist 806. This or similar processes can be repeated as needed to build up more complex multilayer guide plate structures.

Figure 10A:
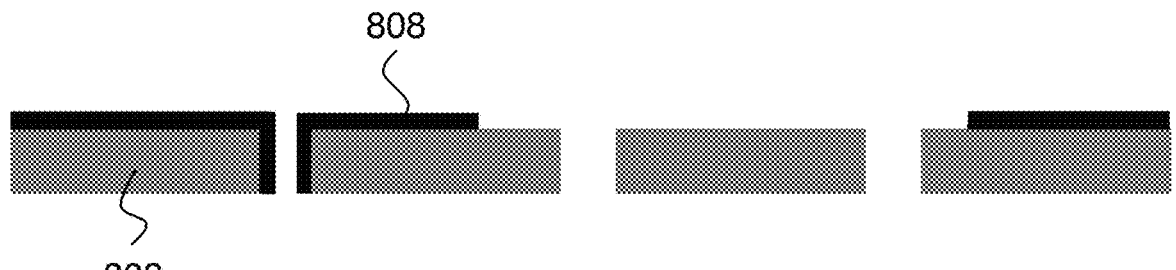
FIGS. 10A-10H show a third exemplary fabrication sequence.
Figure 10B:
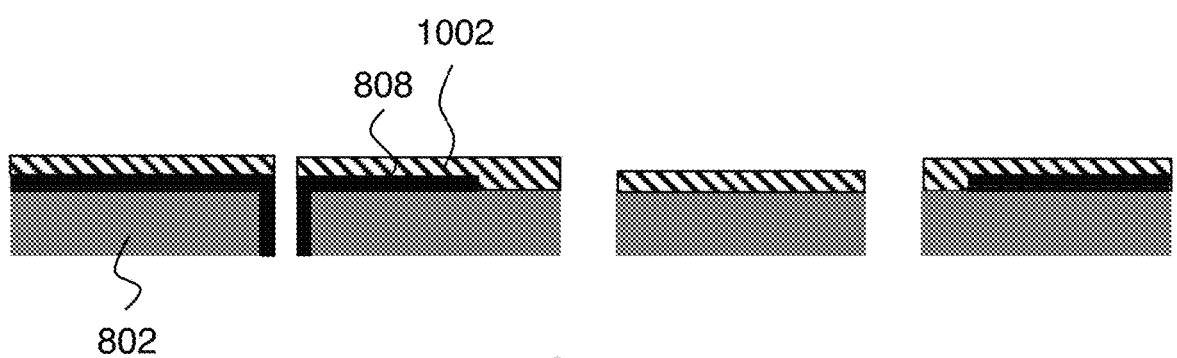
Figure 10C:
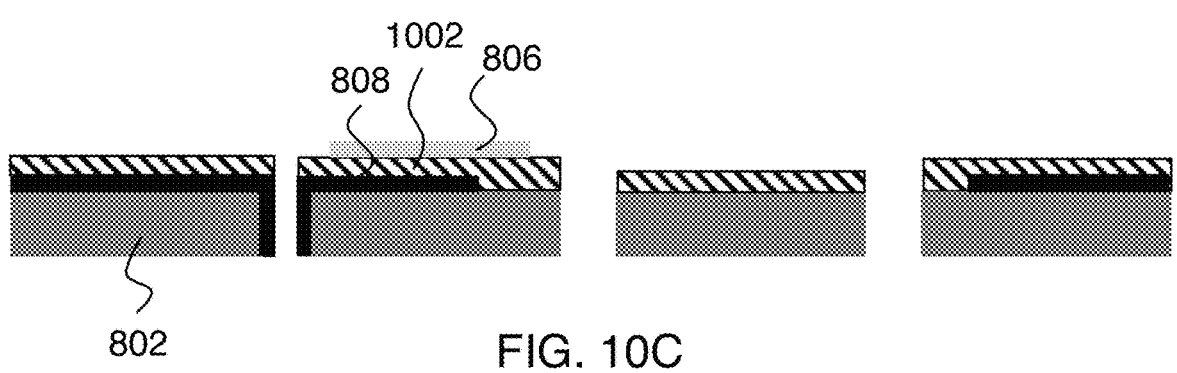
Figure 10D:
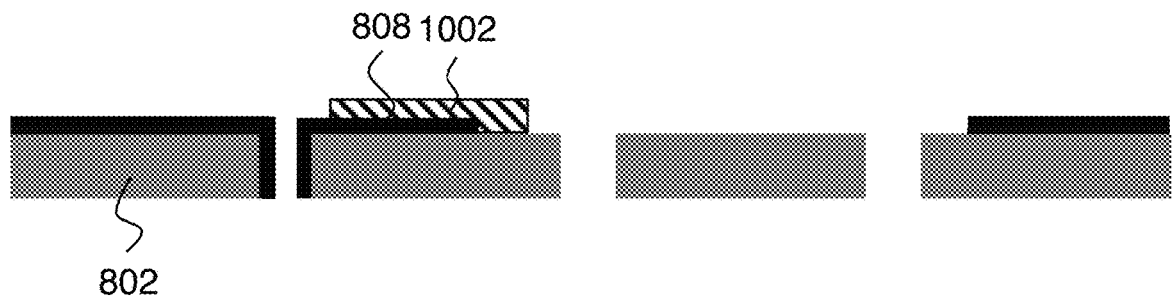
Figure 10E:
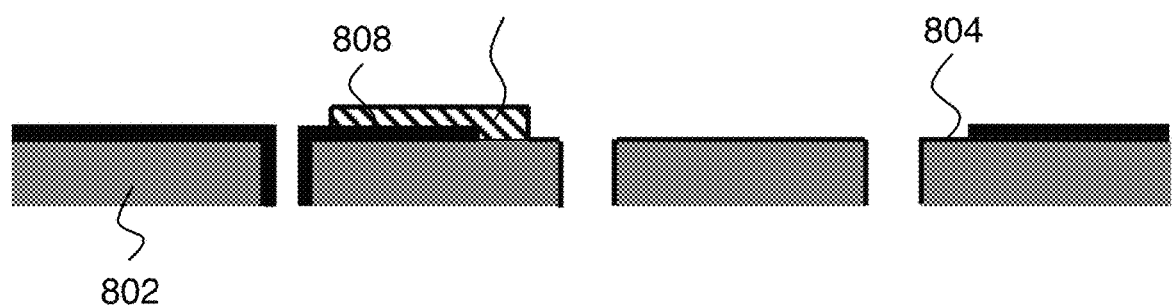
Figure 10F:
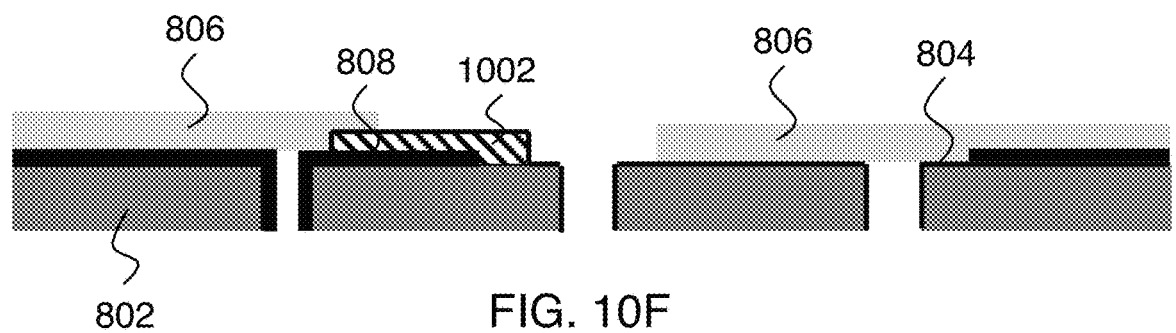
Figure 10G:
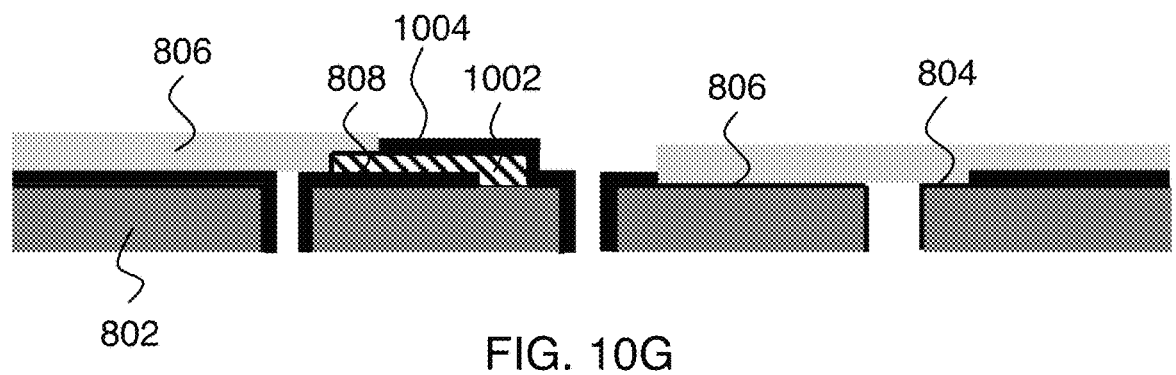
Figure 10H:
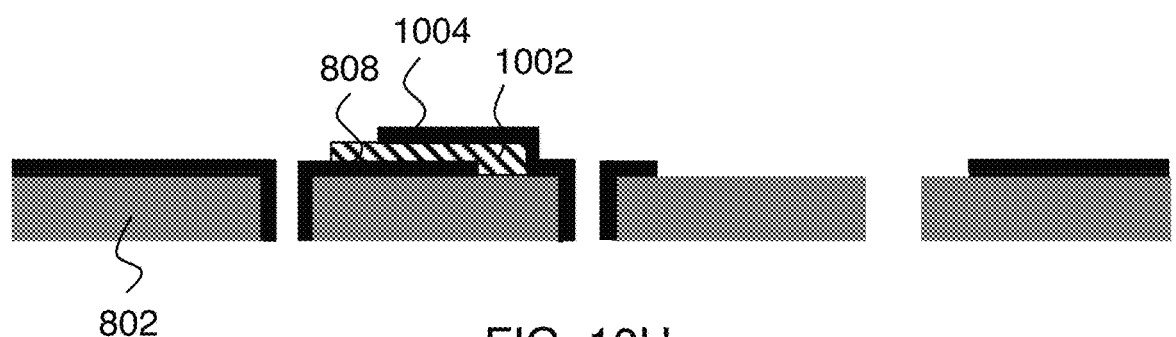

FIGS. 10A-H show one such example. Here FIG. 10A shows a finished guide plate as on FIG. 8D. FIG. 10B shows the result of depositing a dielectric 1002 (e.g., by sputtering, chemical vapor deposition, physical vapor deposition). FIG. 10C shows the result of depositing photoresist 806 and patterning it. FIG. 10D shows the result of selectively etching dielectric 1002 as laterally defined by the photoresist and as vertically defined by the etch selectivity (i.e., the etch removes the dielectric but does not attack metal 808 or ceramic 802). FIG. 10E shows the result of depositing a new seed layer 804 (e.g., by sputtering). FIG. 10F shows the result of depositing photoresist 806 and patterning it. FIG. 10G shows the result of depositing metal 1004 as defined by the photoresist. FIG. 10H shows the finished guide plate after removal of the photoresist and etching away the metal seed layer 804. Here dielectric 1002 separates metal 808 from metal 1004, thereby forming a capacitor. For simplicity in this sequence, no attempt has been made to distinguish seed metal layers from any adjacent metal layers.

Practice of the invention does not depend critically on the composition of metals and/or dielectrics deposited on the guide plate substrate, and it also does not depend critically on the composition of the guide plate substrate. The preceding fabrication sequences are exemplary, so any other processing approach suitable for creating structures as described above can also be employed.

The invention claimed is:

1. A guide plate for a probe array for testing electrical devices, the guide plate comprising:
   an electrically insulating ceramic substrate having a hole pattern corresponding to a predetermined probe pattern;
   a patterned metal layer disposed on the electrically insulating ceramic substrate such that at least two holes of the hole pattern are electrically connected to each other, and such that at least two holes of the hole pattern are electrically insulated from each other;
   wherein the guide plate is configured to provide mechanical support for probes passing through the holes of the hole pattern;
   wherein the guide plate is configured to have the probes pass through the holes of the hole pattern without being affixed to the holes of the hole pattern;
   further comprising one or more passive component structures disposed to provide one or more compensating impedances between holes of the hole pattern, wherein the one or more passive component structures are each connected to two or more parts of the patterned metal layer.

2. The guide plate of claim 1, wherein a thickness of the patterned metal layer is 10 microns or less.

3. The guide plate of claim 1, wherein the one or more passive component structures are selected from the group consisting of: integrated capacitors, discrete component capacitors, integrated inductors, discrete component inductors, integrated resistors, and discrete component resistors.

4. A probe array comprising:
   a top guide plate according to claim 1;
   a bottom guide plate according to claim 1;
   a probe array including two or more probes, wherein each probe of the probe array passes through corresponding holes in the top guide plate and in the bottom guide plate;
   wherein at least one of the probes of the probe array is a ground probe making electrical contact to the top guide plate and to the bottom guide plate;
   wherein at least one of the probes of the probe array is a signal probe that is electrically insulated from the ground probe.

5. The probe array of claim 4, wherein the one or more compensating impedances of the top and bottom guide plates are configured to improve an impedance match for probing a device under test with the signal probe and the ground probe.

6. The probe array of claim 5, further comprising one or more intermediate guide plates disposed between the top guide plate and the bottom guide plate;
   wherein each intermediate guide plate comprises:
   a) an electrically insulating ceramic substrate having a hole pattern corresponding to a predetermined probe pattern;
   b) a patterned metal layer disposed on the electrically insulating ceramic substrate such that at least two holes of the hole pattern are electrically connected to each other, and such that at least two holes of the hole pattern are electrically insulated from each other; and
   c) one or more passive component structures disposed to provide one or more compensating impedances between holes of the hole pattern;
   wherein each probe of the probe array passes through corresponding holes in the one or more intermediate guide plates; and
   wherein the one or more compensating impedances of the one or more intermediate guide plates are configured to improve the impedance match for probing a device under test with the signal probe and the ground probe.

7. The guide plate of claim 1, wherein the passive component structure is a capacitor provided by a gap between a signal hole and a ground part of the patterned metal layer connected to a ground hole of the predetermined probe pattern.

8. The guide plate of claim 1, wherein the passive component structure is a capacitor provided by a gap between a signal part of the patterned metal layer connected to a signal hole of the predetermined probe pattern and a ground part of the patterned metal layer connected to a ground hole of the predetermined probe pattern.

9. The guide plate of claim 8, wherein the gap is configured as a spacing between two interdigitated metal regions.

10. The guide plate of claim 1, wherein the passive component structure is a discrete component capacitor connected between a signal part of the patterned metal layer connected to a signal hole of the predetermined probe pattern and a ground part of the patterned metal layer connected to a ground hole of the predetermined probe pattern.

11. A method of making a guide plate for a probe array for testing electrical devices, the method comprising:
   providing an electrically insulating ceramic substrate having a hole pattern corresponding to a predetermined probe pattern;
   depositing and patterning a metal layer on the electrically insulating ceramic substrate such that at least two holes of the hole pattern are electrically connected to each other, and such that at least two holes of the hole pattern are electrically insulated from each other;
   wherein the guide plate is configured to provide mechanical support for probes passing through the holes of the hole pattern;
   wherein the guide plate is configured to have the probes pass through the holes of the hole pattern without being affixed to the holes of the hole pattern;
   wherein the guide plate further comprises one or more passive component structures disposed to provide one or more compensating impedances between holes of the hole pattern, wherein the one or more passive component structures are each connected to two or more parts of the patterned metal layer.

12. The method of claim 11, wherein a thickness of the metal layer is 10 microns or less.

\* \* \* \* \*